United States Patent [19]

Dhong et al.

[11] Patent Number: 5,336,629
[45] Date of Patent: Aug. 9, 1994

[54] FOLDER BITLINE DRAM HAVING ACCESS TRANSISTORS STACKED ABOVE TRENCH STORAGE CAPACITORS, EACH SUCH TRANSISTOR EMPLOYING A PLANAR SEMICONDUCTOR BODY WHICH SPANS ADJACENT CAPACITORS

[75] Inventors: Sang H. Dhong, Mahopac; Wei Hwang, Armonk; Lewis M. Terman, South Salem; Matthew R. Wordeman, Mahopac, all of N.Y.

[73] Assignee: International Business Machines Corporation, Armonk, N.Y.

[21] Appl. No.: 975,655

[22] Filed: Nov. 13, 1992

Related U.S. Application Data

[62] Division of Ser. No. 740,758, Aug. 5, 1991, Pat. No. 5,214,603.

[51] Int. Cl.$^5$ .................. H01L 21/70; H01L 27/00
[52] U.S. Cl. .......................... 437/52; 437/60; 437/919
[58] Field of Search .................... 437/52, 47–48, 437/60, 919; 257/68, 71, 301, 905–918

[56] References Cited

U.S. PATENT DOCUMENTS

| | | | |
|---|---|---|---|
| 4,649,625 | 3/1987 | Lu | 437/52 |
| 4,734,384 | 3/1988 | Tsuchiya | 437/52 |
| 4,920,065 | 4/1990 | Chin et al. | 437/52 |
| 5,181,089 | 1/1993 | Matsuo et al. | 257/299 |

*Primary Examiner*—Olik Chaudhuri
*Assistant Examiner*—H. Jey Tsai
*Attorney, Agent, or Firm*—Perman & Green

[57] ABSTRACT

A folded bitline DRAM cell is described which includes a trench capacitor and a planar-configured access transistor. The access transistor is stacked over the capacitor and has a first terminal connected thereto. The access transistor includes a planar-oriented gate. A first wordline has a minor surface in contact with the gate and a major surface that is oriented orthogonally to the gate. An insulating pedestal is positioned adjacent the gate and a passing wordline is positioned on the pedestal, the passing wordline having a major surface parallel to the first wordline. In another embodiment, the folded bitline DRAM cell includes a vertically oriented access transistor having one terminal formed on the upper extent of a contact to the trench capacitor, to provide optimum electrical connection thereto.

3 Claims, 9 Drawing Sheets

FIG. 24
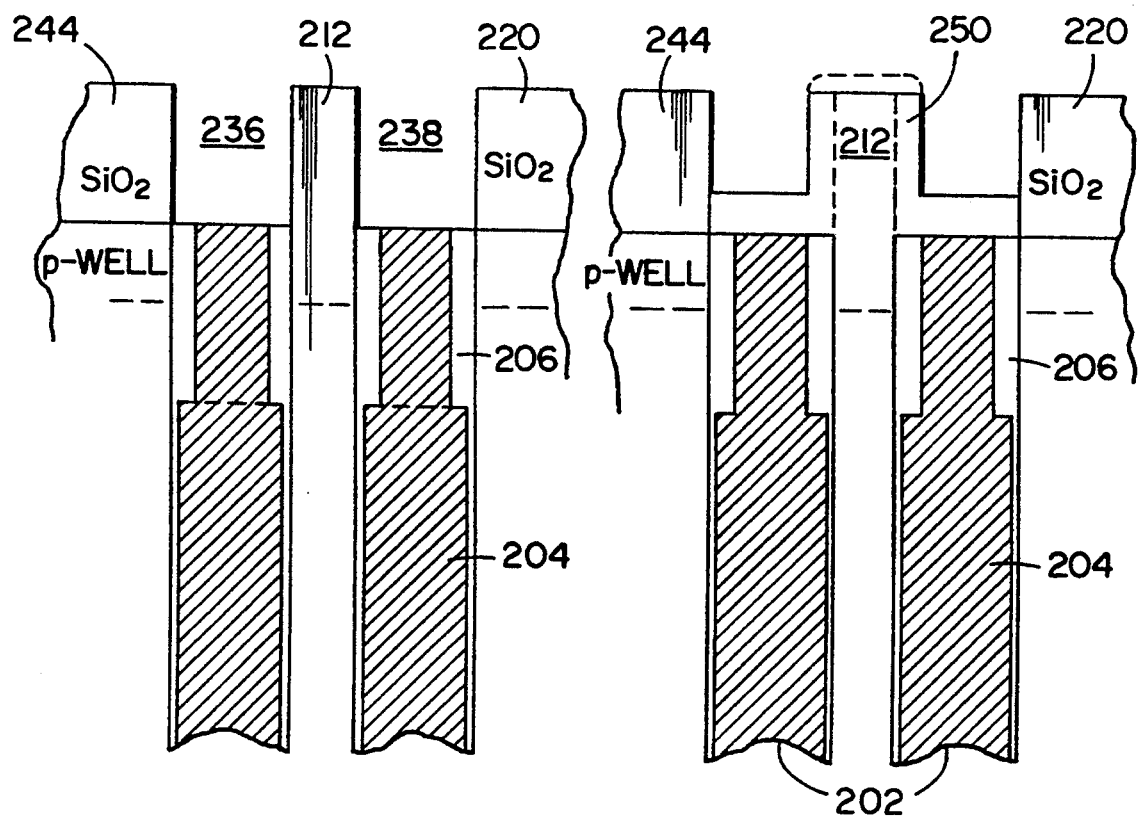
FIG. 25
FIG. 26
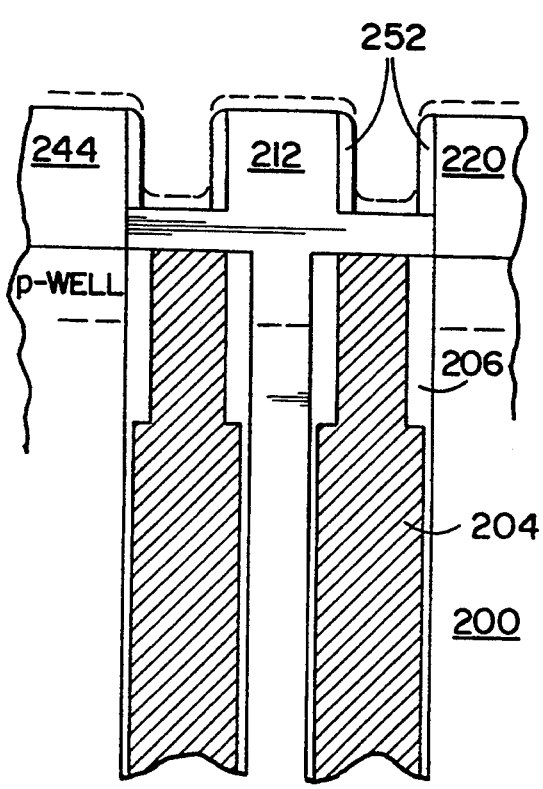
FIG. 27
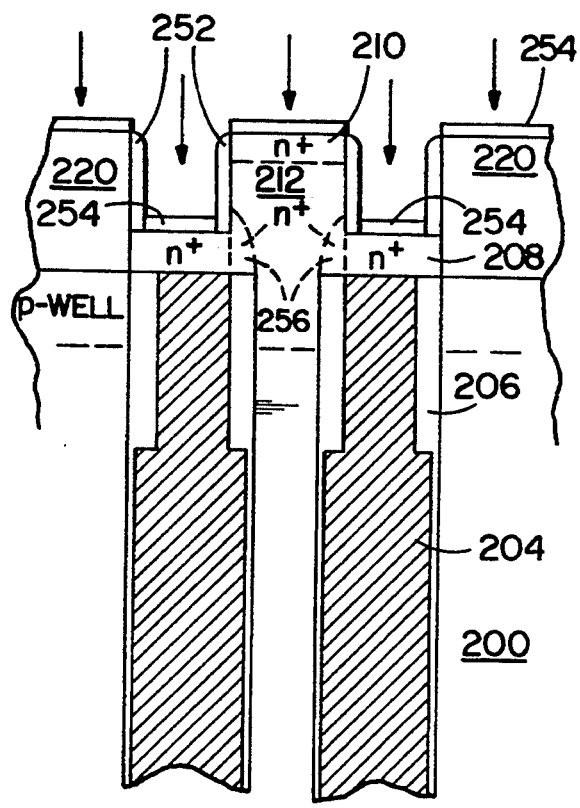

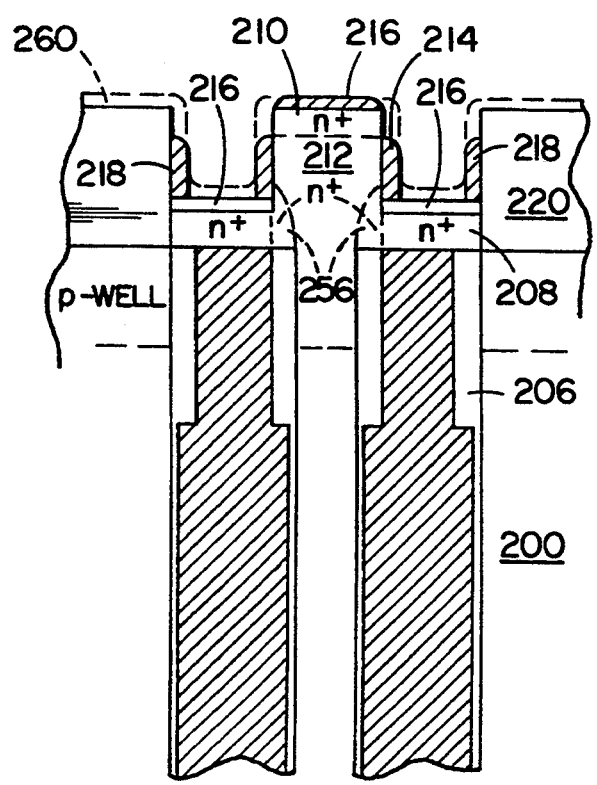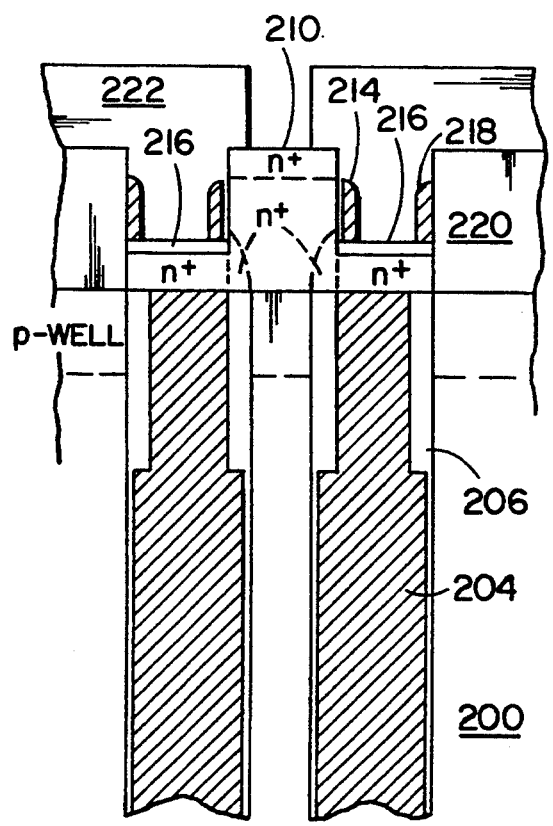

FOLDER BITLINE DRAM HAVING ACCESS TRANSISTORS STACKED ABOVE TRENCH STORAGE CAPACITORS, EACH SUCH TRANSISTOR EMPLOYING A PLANAR SEMICONDUCTOR BODY WHICH SPANS ADJACENT CAPACITORS

This is a continuation of copending application Ser. No. 07/740,758 filed on Aug. 5, 1991, now U.S. Pat. No. 5,214,603.

FIELD OF THE INVENTION

This invention relates to dynamic random access memories (DRAM's) and, more particularly, to a DRAM structure and method for making the structure wherein access transistors are stacked over buried trench memory capacitors.

BACKGROUND OF THE INVENTION

In order to realize ultra-high density DRAM's, it is clear that new memory cell structures and array designs are needed. Prior art configurations do not meet projected cell density requirements for 256 megabits and higher. Prior art cell structures have, in a number of cases, employed three dimensional cell structures to enable denser cell structures. Some of those cell configurations have included memory capacitors formed in trenches, vertically oriented wordlines having high aspect ratio cross-sections, and vertically oriented access transistor structures.

In FIG. 1, a widely used DRAM configuration is shown wherein each cell 10 includes an access transistor 12, storage capacitor 14, bitline 16, wordline 18, and passing wordline 20. The gate of transistor 12 is connected to wordline 18 and the source of transistor 12 is connected to bitline 16. Application of appropriate potentials to bitline 16 and wordline 18 enables data to be either written into or read from capacitor 14 in the known manner. The circuit arrangement shown in FIG. 1 is termed a "folded bitline" structure as the output from cell 10 is supplied across terminals 22 and 24, to a differential sense amplifier, and cell 10 is traversed by both the connected wordline 18 and the passing wordline 20.

The remaining DRAM cells in FIG. 1 are identical, with passing wordlines 20 and 26 controlling memory cells in rows 24 and 30, and wordlines 18 and 32 controlling the alternate row cells.

In FIG. 2, a planar view of an exemplary structure of a cell 10 and in FIG. 3 a section, taken along line 3—3 of the cell of FIG. 2 is illustrated. In FIGS. 2 and 3, it can be seen that wordline 18 forms the gate structure of transistor 12, whereas passing wordline 20 rests upon thick oxide layer 36 and does not affect the operation of cell 10. Bitline 16 is connected via stud 38 to source 40 of transistor 12. Drain 42 connects to trench capacitor 44 (via contact strap 41) which is, in turn, formed in substrate 46. Prior art references disclosing DRAM cells that use various aspects of the cell arrangement shown in FIGS. 2 and 3 can be found in U.S. Pat. Nos. 4,688,063 to Lu et al., 4,798,794 to Ogura et al. and 4,734,384 and 4,922,313 to Tsucbiya.

High density DRAM cell structures can be found in U.S. Pat. Nos. 4,873,560 to Sunami et al. and in U.S. Pat. No. 4,916,524 to Teng et al. In the Sunami et al. patent (see FIG. 27 of Sunami et al.), vertically oriented wordlines and passing wordlines are employed with each cell having an in-trench, vertically oriented access transistors. The drain of each vertical access transistor in Sunami et al. connects to the trench capacitor via an opening in the insulating layer in the trench's side wall. In the Teng et al. patent, a wordline has a T shaped portion that makes contact with the gate of a vertical access transistor emplaced above a trench capacitor. As in Sunami et al., the access transistor of Teng et al. exhibits a drain which connects to a contact of the trench capacitor via an opening in the insulating layer of the trench's sidewall.

Notwithstanding the innovations shown in the above-noted prior art, additional structural compaction of access transistors and trench capacitors is required to enable ultra-high DRAM densities to be achieved. Furthermore, even where vertically oriented access transistors are employed, care must be taken to assure that a reliable, wide-area contact is maintained between the drain of the access transistor and the trench capacitor's internal contact.

Accordingly, it is an object of this invention to provide an ultra-dense packing arrangement for a DRAM memory cell.

It is another object of this invention to provide an ultra-dense DRAM structure which makes use of planar-oriented access transistors.

It is still another object of this invention to provide an ultra-dense DRAM structure which makes use of vertically oriented access transistors, wherein drain/trench capacitor contact is enhanced.

It is yet another object of this invention to provide an improved method for constructing an ultra-dense DRAM structure.

SUMMARY OF THE INVENTION

A folded bitline DRAM cell is described which includes a trench capacitor and a planar-configured access transistor. The access transistor is stacked over the capacitor and has a first terminal connected thereto. The access transistor includes a planar-oriented gate. A first wordline has a minor surface in contact with the gate and a major surface that is oriented orthogonally to a major surface of the gate. An insulating pedestal is positioned adjacent to the gate and a passing wordline is positioned on the pedestal, the passing wordline having a major surface parallel to the first wordline. In another embodiment, the folded bitline DRAM cell includes a vertically oriented access transistor having one terminal formed on the upper extent of a contact to the trench capacitor, to provide optimum electrical connection thereto.

DESCRIPTION OF THE DRAWINGS

FIGS. 20–29 show progressive manufacturing stages to achieve the cell structure shown in FIG. 18.

DETAILED DESCRIPTION OF THE INVENTION

Figure 1:
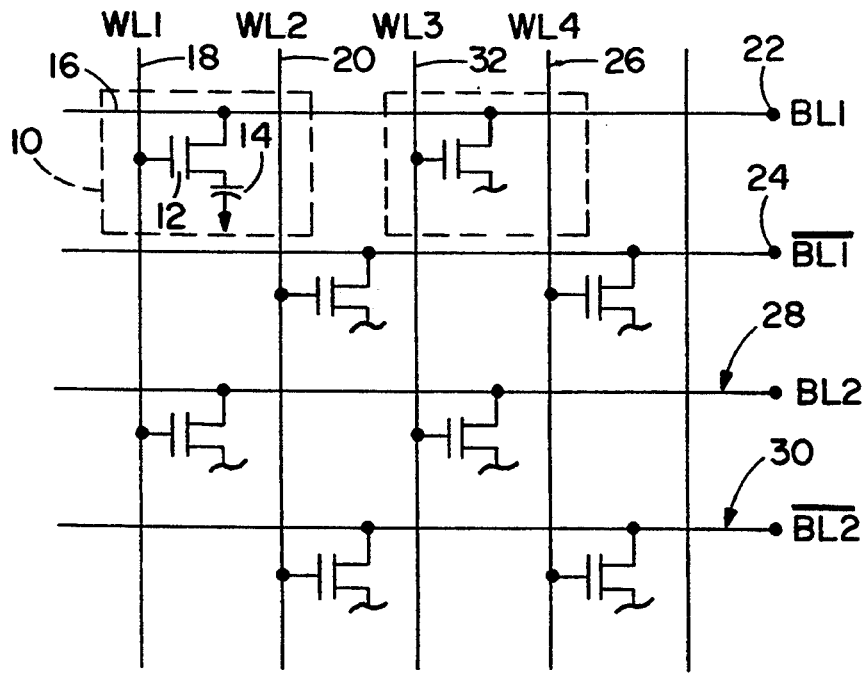
FIG. 1 is a partial circuit diagram of a prior art folded bitline DRAM array.
Figure 2:
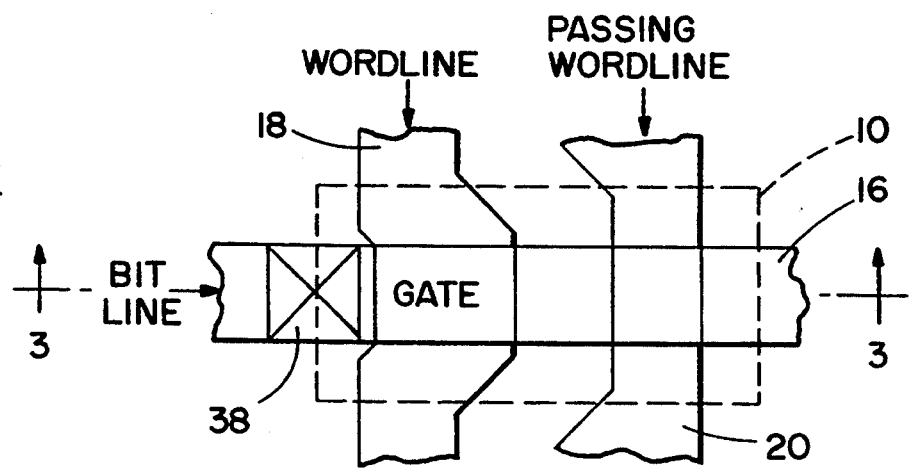
FIG. 2 is a schematic plan view of an exemplary DRAM cell in the array of FIG. 1.
Figure 3:
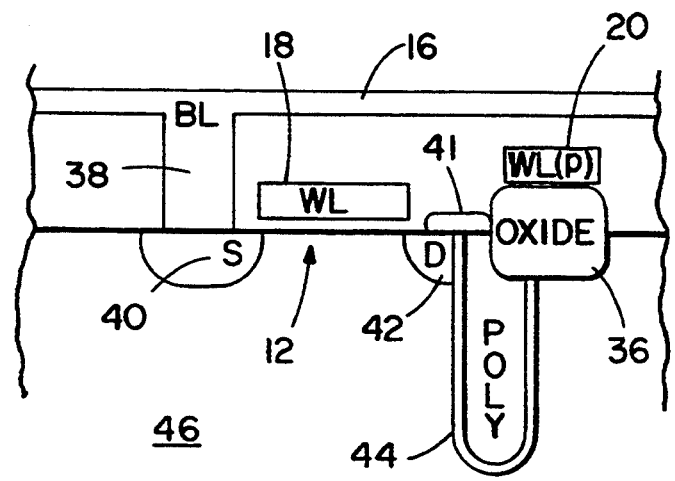
FIG. 3 is a section of the cell of FIG. 2 taken along line 3—3.
Figure 4:
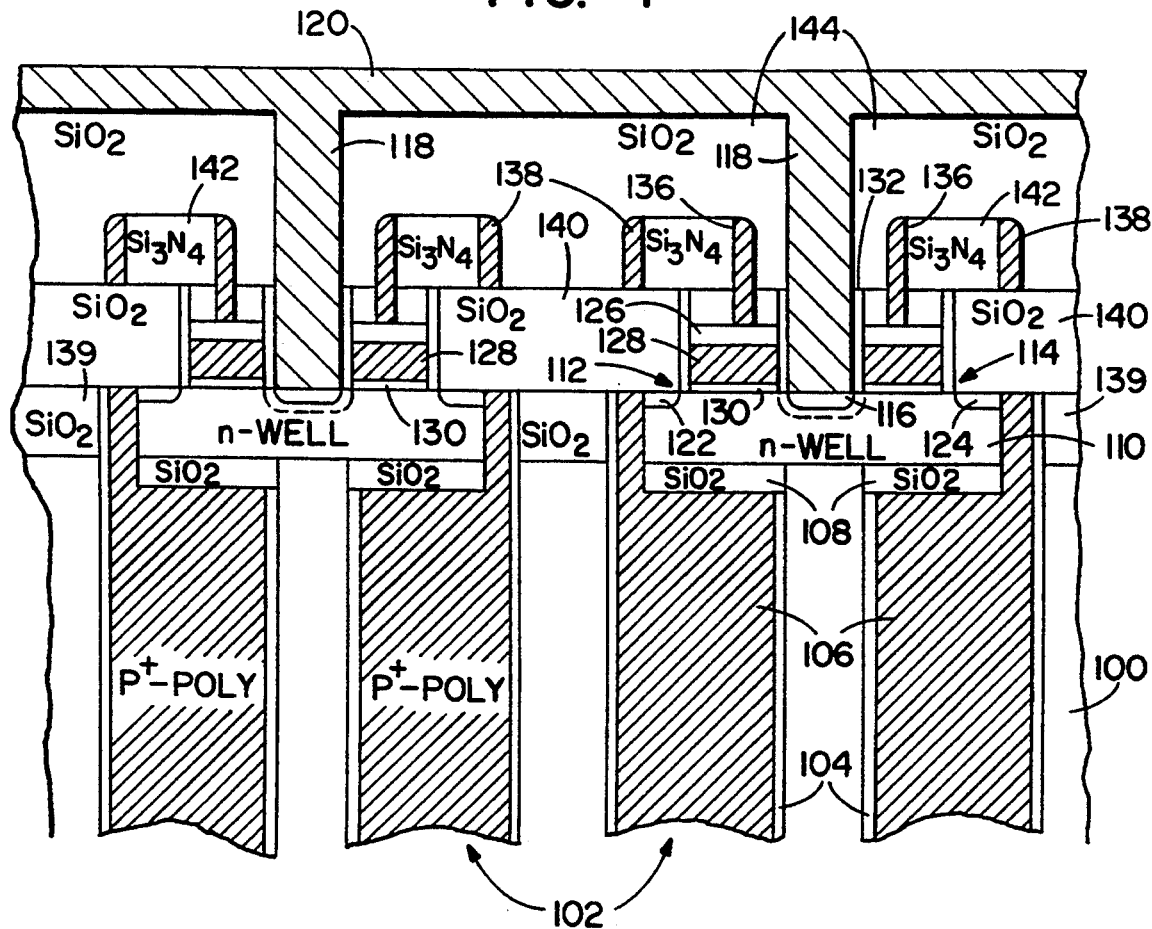
FIG. 4 is a section of a DRAM cell array structure that includes the invention.
Figure 5:
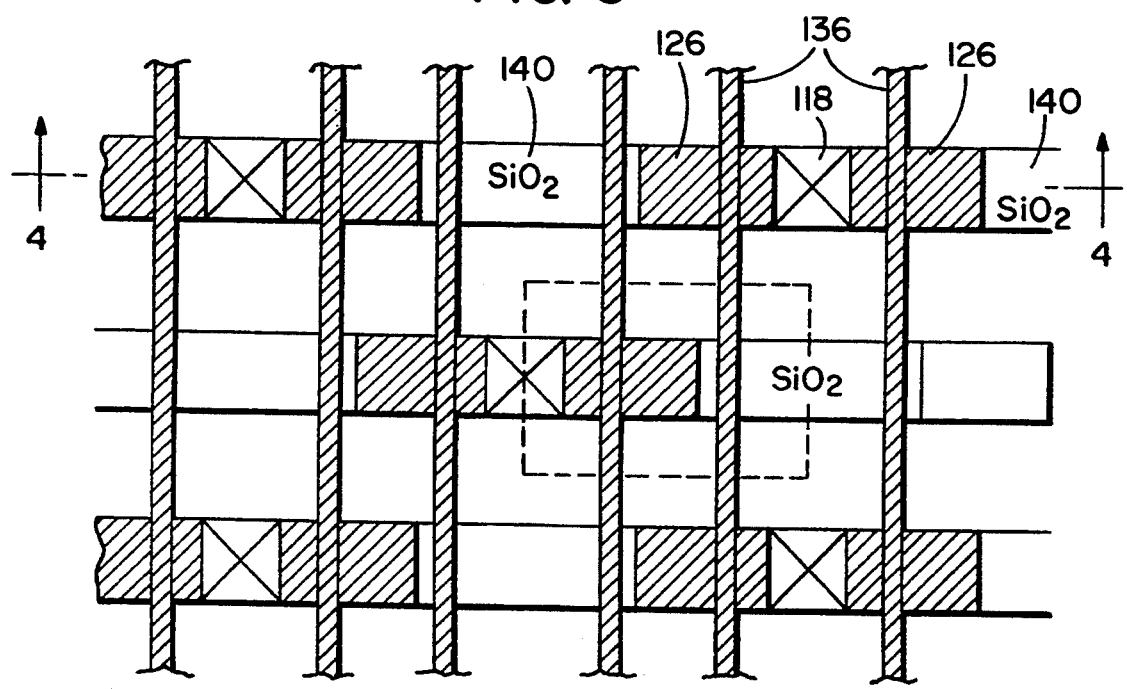
FIG. 5 is a plan view of the cell structure of FIG. 4.

Referring now to FIGS. 4 and 5, a section of a DRAM array incorporating the invention is shown (taken along line 4—4 in FIG. 5). In FIG. 5, a plan view of the DRAM array is shown wherein the bitline structure and a covering dielectric overcoat have been removed. The plan view .of FIG. 5 does not show all of the details of the structure, to avoid confusion.

Referring now to FIG. 4, the DRAM structure resides on a p+ substrate 100 into which a plurality of trench capacitors 102 have been emplaced. Each trench capacitor includes an insulating layer 104 and an internal p+ polysilicon contact fill 106. At their upper extremities, adjacent pairs of trench capacitors 102 have a recess formed therein, which recess is covered by an insulating layer 108 (e.g. $SiO_2$). Bridging pairs of $SiO_2$ layers 108 is an n-well epitaxial silicon layer 110 into which is formed a pair of access transistors 112 and 114.

Transistors 112 and 114 share a common source contact 116 that is, in turn, connected to bitline stud 118 that further connects to bitline 120. Transistors 112 and 114 have drain contacts 122 and 124, respectively, which make connection to polysilicon fill regions 106 and thus to trench capacitors 102. The gate structures of each of transistors 112 and 114 are identical and comprise a metallic conducting layer 126 that, in one embodiment comprises a combination of titanium silicide and titanium nitride. A polysilicon layer 128 supports metallic layer 126 and is separated from the n-well region by an MOS device gate insulating layer 130. A further insulating layer 132 is formed on either side of bitline stud 118 to prevent shorting of combined gate structure 126, 128 to n-well 110.

Word lines 136 have their major planar surface oriented vertically to gate structure 126, 128 and make electrical contact therewith through their minor planar surface. A pair of passing wordlines 138 are similarly oriented, but rest on $SiO_2$ pedestal 140. A smaller $Si_3N_4$ pedestal 142 separates wordlines 136 and 138 and provides insulation therebetween. Finally, an $SiO_2$ overcoat 144 provides a support for bitline 120.

The above-described structure enables a high level of compaction to be achieved by stacking planar transistors 112 and 114 over trench capacitors 102 and allowing transistors 112 and 114 to share a common bitline source contact 116. Further, by employing a T-shaped arrangement between gate metallization 126 and wordline 136, a further savings in silicon surface area is achieved. The use of insulating pedestals 140 enables the passing wordline 138 to pass over an active cell and prevents interaction therebetween. In addition, passing wordlines 138 perform a shield function between adjacent cells.

Figure 6:
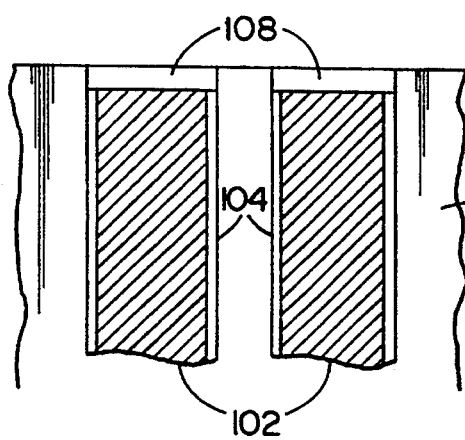
FIGS. 6–17 show progressive manufacturing stages in achieving the cell structure shown in FIG. 4.

Turning now to FIGS. 6 et sequence, the method employed to fabricate the DRAM structure shown in FIGS. 4 and 5 will be described. As shown in FIG. 6, the process begins with substrate 100 having buried storage capacitors 102 constructed therein using standard trench technology. Each capacitor 102 is covered with a thick cap oxide 108 that is coplanar with the upper surface of substrate 100.

Figure 7:
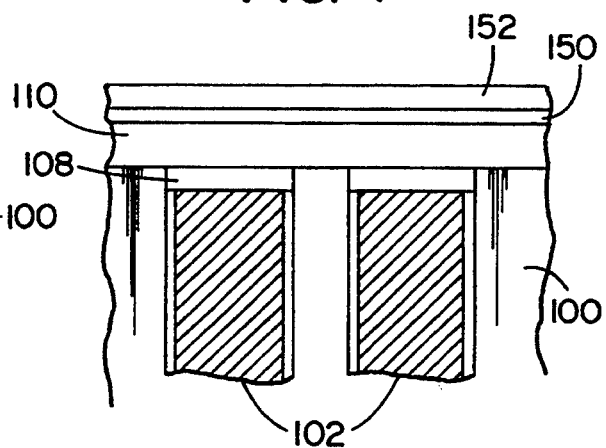
Figure 8:
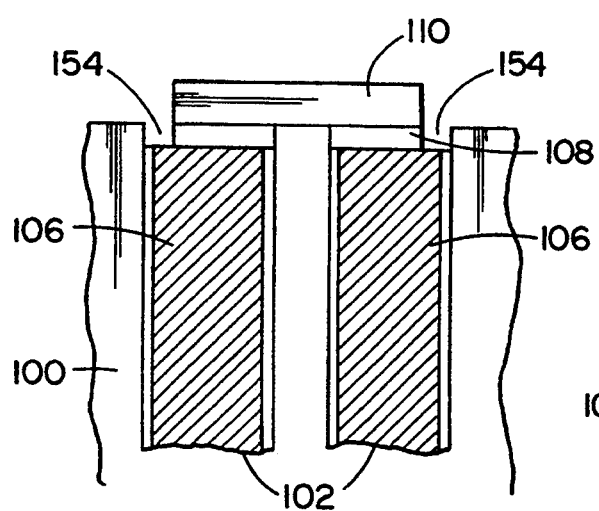

The next step is shown in FIG. 7 and comprises growing a silicon epitaxial layer 110 vertically on the upper silicon surface of substrate 100. Epitaxial layer 110 grows laterally over cap oxide 108 and forms a continuous upper surface. Subsequently, a composite layer of silicon nitride 152 and $SiO_2$ 150 is formed over epitaxial layer 110. Next (FIG. 8), oxide and nitride layers 150 and 152 are lithographically patterned and the stack of layers 152, 150 and 110 is etched to create the mesa silicon structure 110. After mesa 110 is formed, the exposed areas of oxide cap 108 are etched, thereby providing openings 154 to polysilicon contact regions 106.

Figure 9:
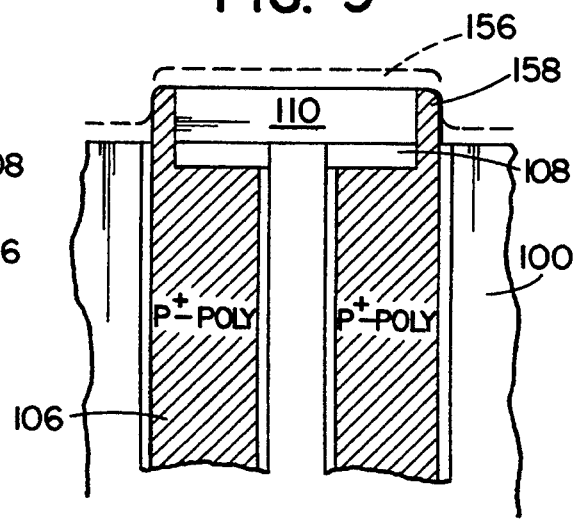
Figure 10:
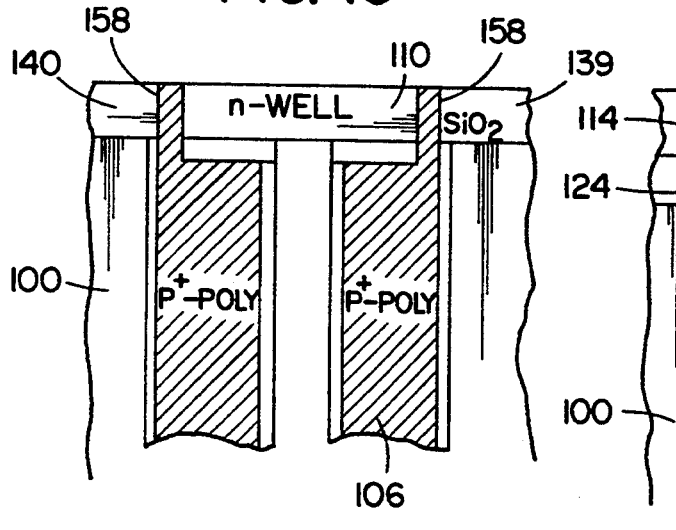

Turning to FIG. 9, an intrinsic polysilicon layer 156 is conformally deposited over the wafer. Layer 156 is then subjected to a directional reactive ion etch (RIE) so that the planar portions of layer 156 are removed leaving vertical polysilicon straps 158 in contact with polysilicon regions 106. After the RIE step, (see FIG. 9), an $SiO_2$ layer 139 is deposited to fill the depressions on the either side of vertical polysilicon straps 158. A subsequent RIE or chemical-mechanical polishing planarization is then used to effect a coplanar surface between oxide regions 139 and silicon mesa 110. It is to be noted that both intrinsic polysilicon sidewall straps 158 are kept in place during the $SiO_2$ deposition and planarization steps. Subsequently, the upper surface of the substrate is selectively ion implanted to form an n-well in silicon region 110.

Figure 11:
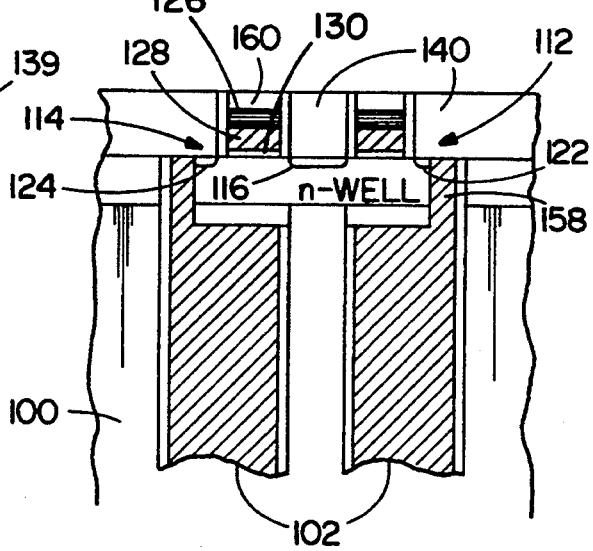

Turning to FIG. 11, the formation of access transistors 112 and 114 and their gate structures will be described. Initially, a gate oxide layer 130 is grown, followed by deposition of a gate electrode stack that comprises a polysilicon layer 128, a composite titanium silicide/titanium nitride layer 126, and a cap layer of silicon nitride 160. P+ source/drain junction formation to create source 116 and drains 122 and 124 are followed by the deposition of $SiO_2$ layer 140. The sidewall p+ polysilicon straps 158 are doped simultaneously during the p+ source/drain junction formations.

With respect to the formation of the multi layer gate structures, once the underlying oxide layer is formed, a polysilicon layer 128 is deposited and a titanium layer is deposited thereon. A subsequent reaction forms titanium silicide which is then followed by a titanium nitride deposition that acts as a diffusion barrier during the subsequent p+ junction formations.

Figure 12:
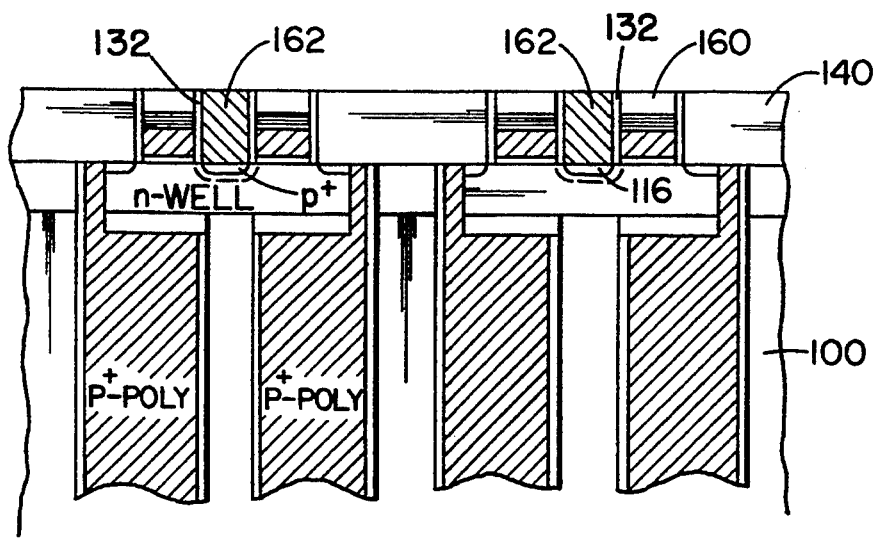

As shown in FIG. 12, a bitline contact region is now opened to make contact with source terminals 116. This is achieved by lithographic patterning and etching to open contact vias to source terminals 116. An insulating spacer 132 is formed on the wall of the contact, followed by the formation of tungsten metal inserts 162.

Figure 13:
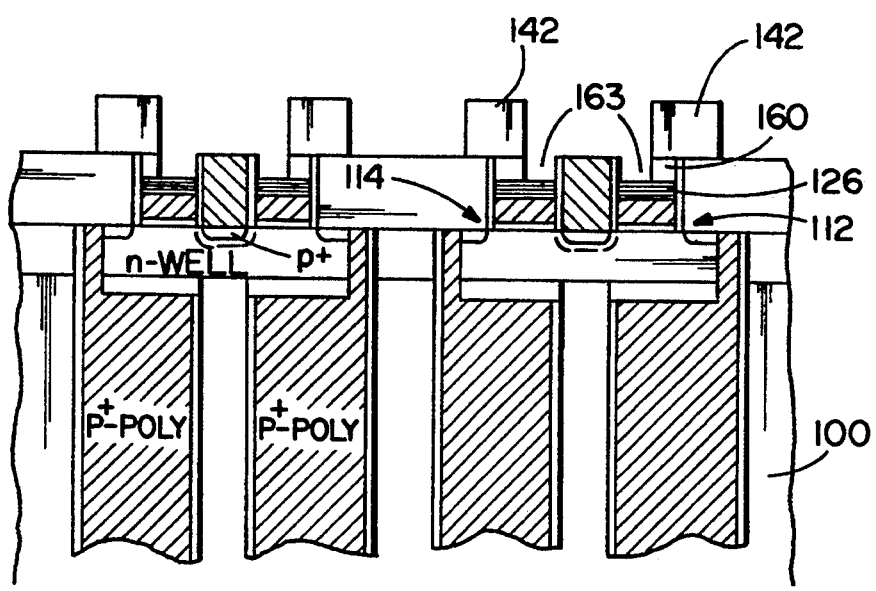
Figure 14:
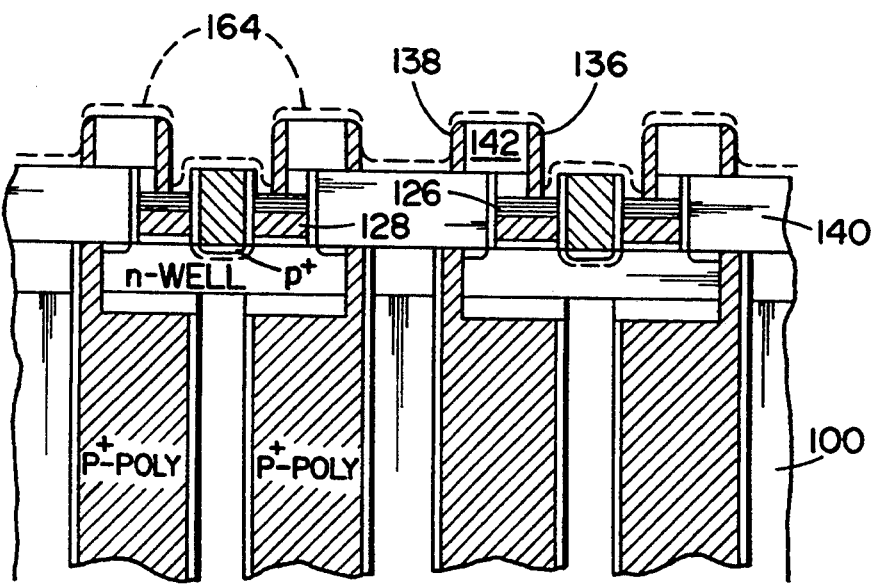

A thick nitride layer (see FIG. 13) is now laid down over the upper surface of the substrate and selectively etched to leave pedestals 142 and to provide openings 163 through nitride caps 160. This action exposes the upper metalization layer 126 of the gates of transistors 112 and 114. The process proceeds as shown in FIG. 14, where a conformal coating of a conductor, such as a p+ polysilicon layer 164, is conformally deposited over the entire upper surface of the wafer. Layer 164 is anisotropically reactive ion etched to remove its planar portions and leave conductive polysilicon side straps 136 and 138 adherent to silicon nitride pedestals 142. This results in the formation of wordlines 136 which make contact to gate metalization layers 126. In addition, passing wordlines 138 are rendered by this process and pass over mesas 140 to adjacent cell structures.

Figure 15:
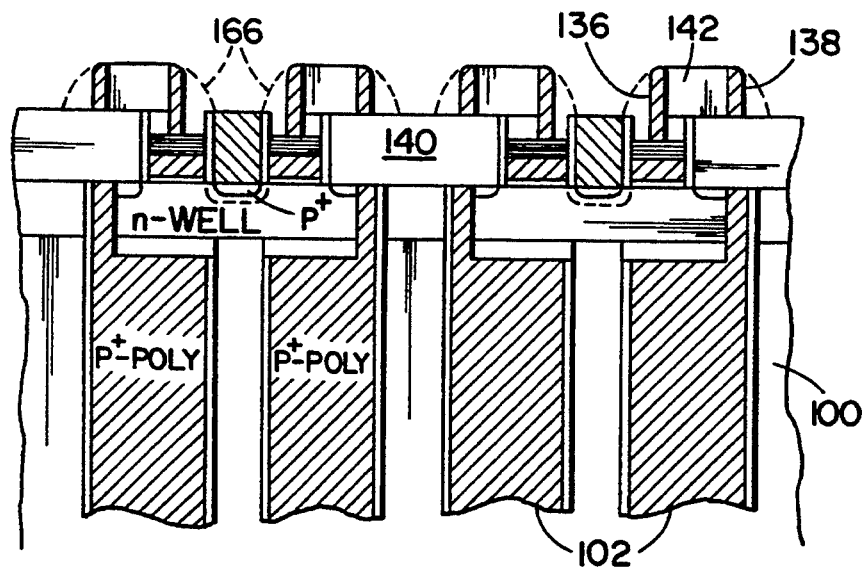
Figure 16:
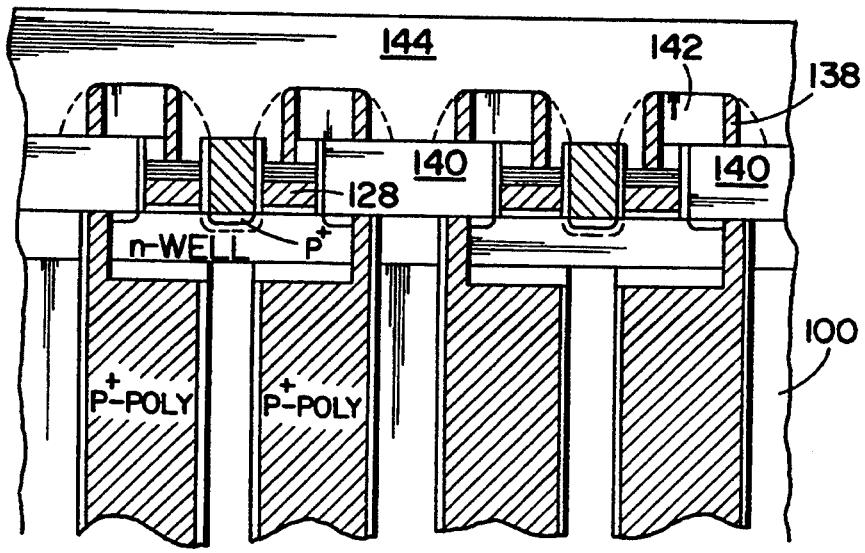
Figure 17:
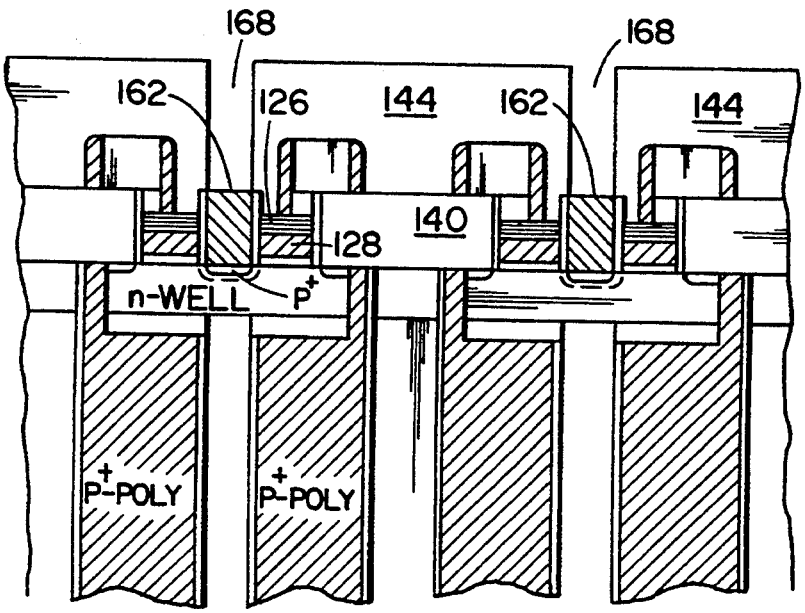

Turning to FIG. 15, a layer of chemical vapor deposited silicon nitride is then conformally deposited over the upper surface of the wafer and subsequently anisotropically etched with an etchant that does not etch silicon oxide. As a result, nitride regions 166 remain and provide a less abrupt topography for the upper surface of the wafer. Next, a further oxide layer 144 (see FIG. 16) is deposited on the wafer and is subsequently planarized, patterned and etched (FIG. 17) to form bitline contact vias 168 that expose tungsten contact layers 162. Layer 166 allows isolation between the bitline and wordline by providing etch selectivity during the bitline contact via etch. Then, bitline metalization 120 is deposited and patterned (see FIG. 4), and the DRAM cell structure of FIG. 4 is complete.

Figure 18:
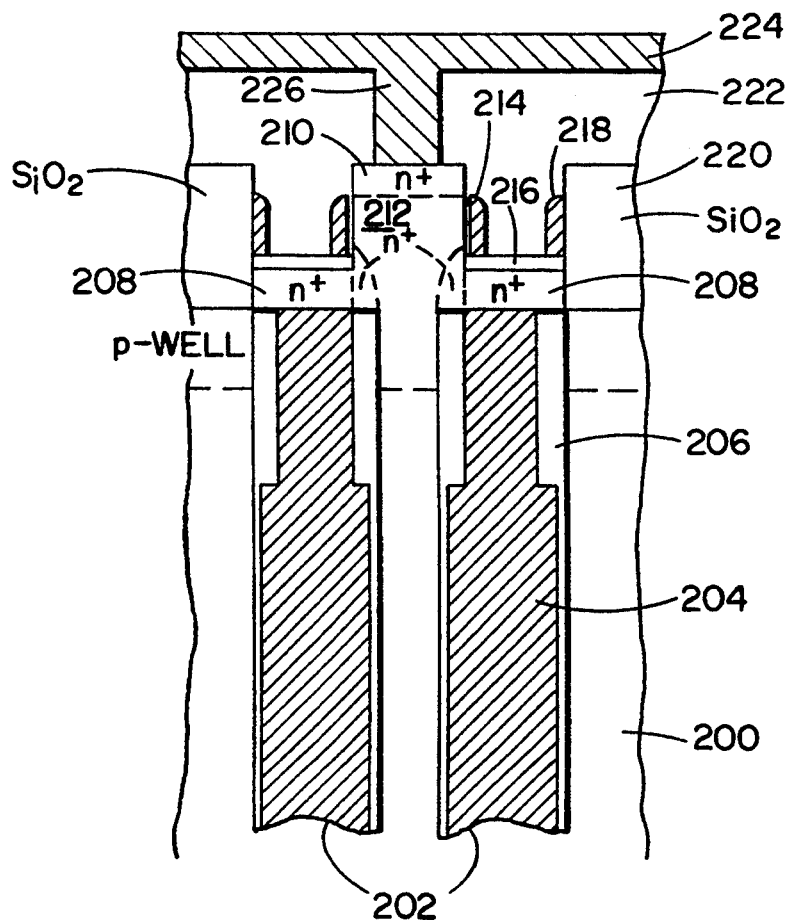
FIG. 18 is a section of a DRAM cell including another embodiment of the invention.
Figure 19:
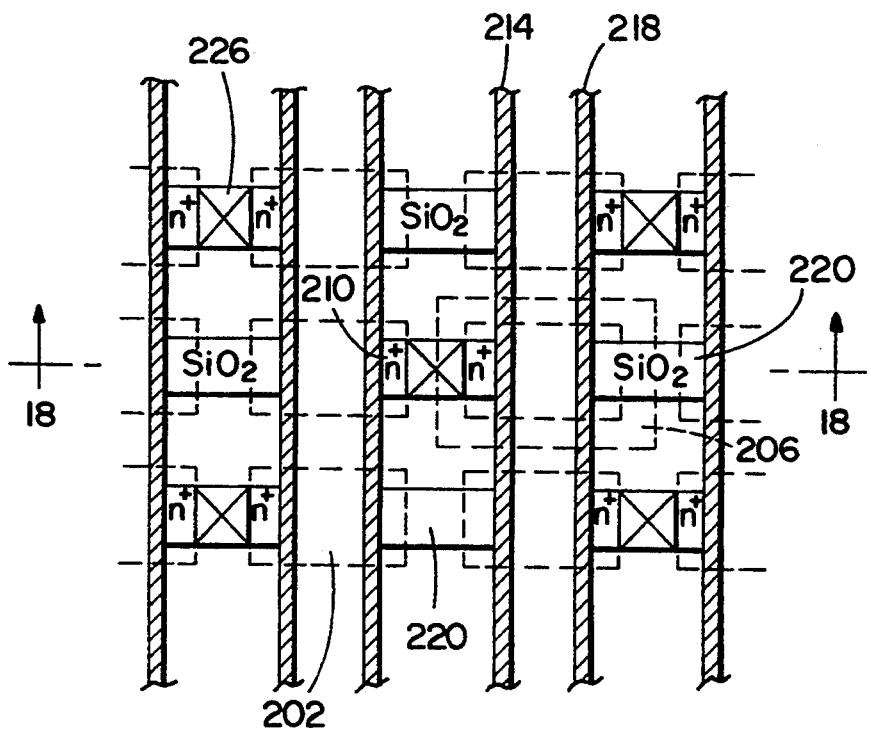
FIG. 19 is a plan view of a DRAM cell array including the cell structure shown in FIG. 18.

In FIGS. 18 and 19, a DRAM structure is shown employing vertically oriented access transistors which provide improved contact to buried trench capacitors. The section shown in FIG. 18 is taken along line 18—18 in FIG. 19, which shows a plan view of the DRAM array.

As in the DRAM structure shown in FIG. 18, n-type substrate 200 has a multiplicity of trench capacitors 202 formed therein. Each trench capacitor 202 has a polysilicon fill region 204 which serves as one plate of the trench capacitor. At the upper extremity of each trench capacitor 202, a thickened oxide collar region 206 surrounds the upper extent of the capacitor and tends to decrease leakage current along the trench sidewall from substrate 200 to a covering n+ contact layer 208. Layer 208 acts as the drain for an access transistor whose source 210 is positioned on a silicon pedestal 212. The gate structure for each access transistor comprises a vertically oriented wordline 214 that is adjacent to silicon pedestal 212, and is separated therefrom by a thin gate oxide layer. A further oxide layer 216 separates wordline 214 from n+ drain region 208. A passing wordline 218 is similarly arranged against an oxide pedestal 220. A covering oxide layer 222 provides support and isolation for a bitline 224. Bitline 224 makes contact with n+ source region 210 via bitline stud 226.

The DRAM cell structure shown in FIGS. 18 and 19 provides a large contact area with the upper surface of trench capacitors 202 via n+ region 208. Furthermore oxide mesas 220 form easily constructed supports for passing wordlines 218 and assure good insulation therebetween.

Figure 20:
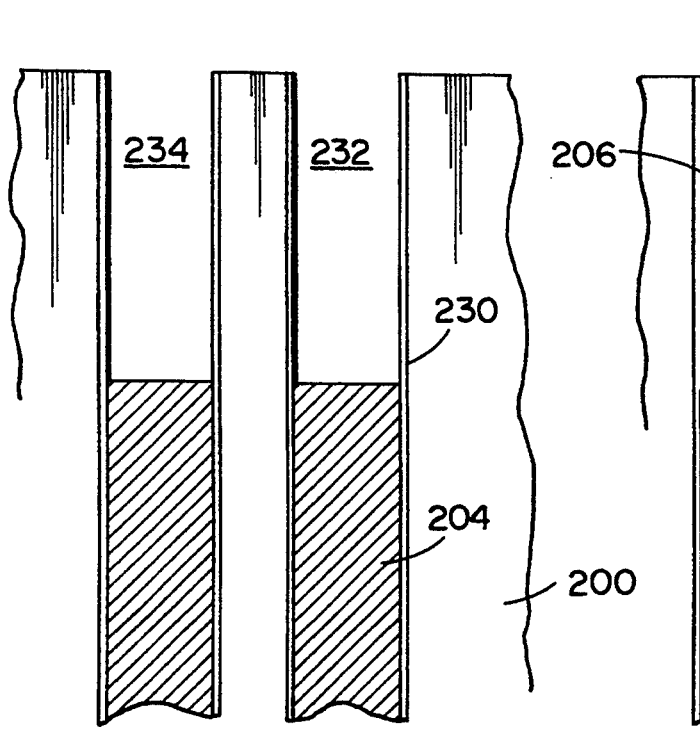
Figure 21:
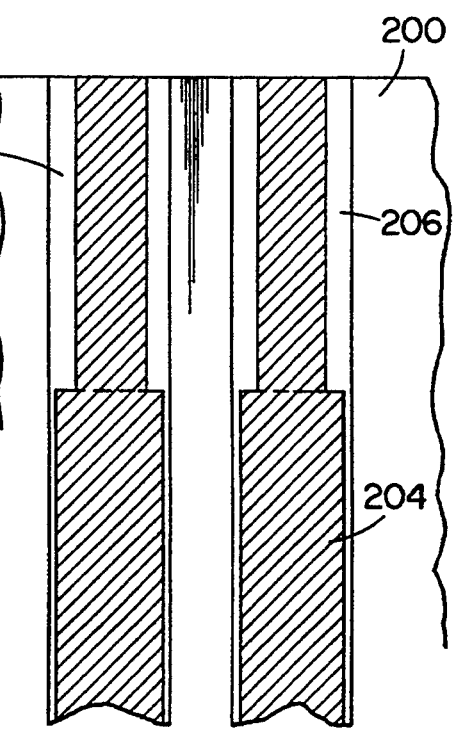

Turning now to FIGS. 20-29, the process for constructing the DRAM structure shown in FIGS. 18 and 19 will be described. As shown in FIG. 20, trenches are formed in substrate 200 and a thin oxide/nitride layer 230 is grown on the internal surfaces thereof. The recesses thus formed are then filled with n+ polysilicon to form conductor region 204. Conductor regions 204 are selectively etched to leave recessed areas 232 and 234. Subsequently, recessed areas 232 and 234 are conformally coated with an oxide which is then directionally etched to form reduced cross-section openings. These openings are then filled with n+ polysilicon. As a result, oxide collars 206 (see FIG. 21) are formed. The upper layer of the substrate is then replanarized and the polysilicon fill is etched back to the top of oxide collars 206 to leave a planar surface.

Figure 22:
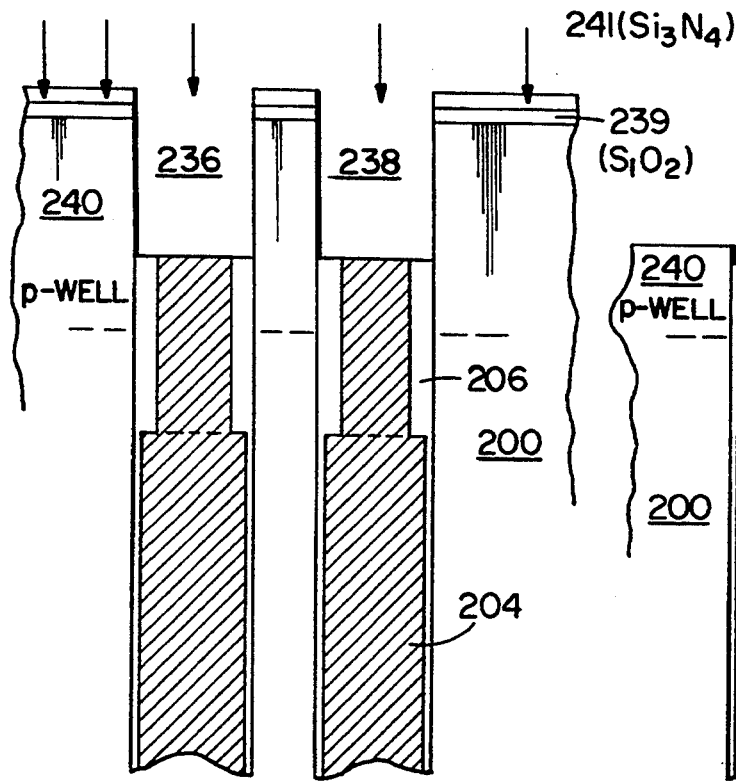

As shown in FIG. 22, $SiO_2$ layer 239 and $Si_3N_4$ layer 241 are deposited on the wafer and then the upper regions of n+ polysilicon 204 and oxide collar 206 are then selectively etched (using photoresist patterning at layers 239 and 241) to provide recessed regions 236 and 238. $SiO_2$ layer 239 and $Si_3N_4$ layer 241 protect the silicon surface during this etch. The substrate is then ion implanted to convert the upper region of substrate 200 into a p-well 240.

Figure 23:
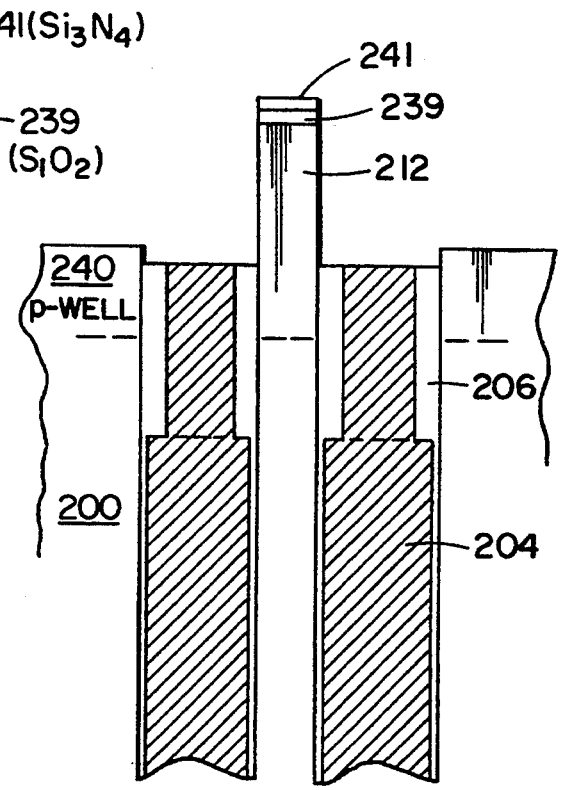

Next, as shown in FIG. 23, a shallow trench isolation structure is created by patterning the upper surface of the wafer 200 and removing a substantial portion of the p-well 240 (including layers 239 and 241), while leaving a silicon pillar 212 between adjacent trench capacitors. Next, as shown in FIG. 24, an oxide layer 220 is laid down on the upper surface of the wafer, planarized, patterned, and etched to open regions 236 and 238 and to expose silicon pillar 212. Then, a thin, selective, epitaxial layer 250 of silicon is grown over silicon pedestal 212, as shown in FIG. 25, extending down into and covering the upper surfaces of trench capacitors 202. The upper surface of the wafer is then planarized, removing the uppermost portions of selective epitaxial layer 250.

A layer of silicon nitride 252 (see FIG. 26) is conformally deposited over the upper surface of the wafer. A subsequent etch removes the planar aspects of nitride layer 252, but leaves sidewall spacers 252. Then, as shown in FIG. 27, a thin silicon oxide layer 254 is grown over the upper surface of the wafer. Next, an ion implantation of an n+ impurity is performed, resulting in the formation of n+ regions 208 and 210. Nitride spacers 252 prevent the doping of the underlying silicon areas, with the silicon regions laterally directly beneath nitride layers 252 being especially important as that is where gate structures will next be formed. The ion implantation is followed by a high temperature process wherein the n+ dopant materials out-diffuse into region 212 to create n+ regions 256.

Turning to FIG. 28, silicon oxide layers 216 are grown on the upper surfaces of n+ layers 208 and 210. Then nitride spacer layers 252 and silicon oxide layer 254 are removed by a selective etch process. A further thin oxide layer (not shown) is grown over the entire upper surface of substrate 200. This is followed by a conformal deposition of an n+ polysilicon layer over the upper surface of substrate 200, which layer is then directionally selectively etched to leave vertically oriented polysilicon regions to be used for passing wordlines 218 and active wordlines 214. Regions 214 additionally act as gates for the thus-formed access transistors. As shown in FIG. 29, a subsequent layer of oxide 222 is emplaced over the upper surface of the wafer, planarized, and patterned to open a pathway to n+ source region 210. Then, as shown in FIG. 18, a bitline 244 is deposited and lithographically defined on the uppermost surface of oxide 222, also making contact with source region 210.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A method for fabricating folded bitline DRAM cells on a semiconductor substrate in which a plurality of trench capacitors have been formed, the method comprising the steps of:

depositing a planar semiconductor region that partially overlaps and spans a pair of adjacent trench capacitors;

forming at least first, second and third contact areas within said planar semiconductor region, at least said first and second contact areas arrayed at extremities of said planar semiconductor region and in contact with terminals of said adjacent trench capacitors;

constructing a bitline stud in contact with said third contact area;

depositing a pair of gate structures between said third contact area and said first and second contact areas, respectively; and producing wordlines that contact said gate structures, and passing wordlines that are insulated from said gate structures.

2. The method as recited in claim 1 wherein said wordlines and passing wordlines are produced by the further steps of:

creating a first mesa of insulating material adjacent each said gate structure;

depositing a second insulating mesa at least partially on said first mesa, said second mesa overlapping a said gate structure;

applying a conformal coating of conductive material over said second mesa and in contact with said gate structure; and subsequently removing aspects of said conductive material that are parallel to a major surface of said substrate to leave vertical strap portions thereof, said vertical strap portions acting as wordlines and passing wordlines.

3. The method as recited in claim 2 wherein said planar semiconductor region is deposited in a recess in said adjacent trench capacitors, said first and second contact areas making electrical connection to rim portions of said trench capacitor terminals.

* * * * *